(12) United States Patent
Yamauchi et al.

(10) Patent No.: US 11,368,147 B2
(45) Date of Patent: Jun. 21, 2022

(54) GATE DRIVE CIRCUIT

(71) Applicant: DENSO CORPORATION, Kariya (JP)

(72) Inventors: Kazuki Yamauchi, Kariya (JP); Yasutaka Senda, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/336,980

(22) Filed: Jun. 2, 2021

(65) Prior Publication Data

US 2021/0288639 A1 Sep. 16, 2021

Related U.S. Application Data

(63) Continuation of application No. PCT/JP2019/044705, filed on Nov. 14, 2019.

(30) Foreign Application Priority Data

Dec. 10, 2018 (JP) .............................. JP2018-230804

(51) Int. Cl.
*H03K 17/0812* (2006.01)
*H02M 1/084* (2006.01)

(52) U.S. Cl.
CPC ...... *H03K 17/08126* (2013.01); *H02M 1/084* (2013.01); *H03K 17/08122* (2013.01)

(58) Field of Classification Search
CPC ...... H03K 17/08126; H03K 17/08122; H02M 1/084
USPC .......................................................... 327/365
See application file for complete search history.

(56) References Cited

U.S. PATENT DOCUMENTS

2009/0002054 A1 1/2009 Tsunoda et al.
2014/0203860 A1 7/2014 Senda

FOREIGN PATENT DOCUMENTS

JP 2013-038843 A 2/2013
JP 2013038843 A * 2/2013

* cited by examiner

*Primary Examiner* — Tomi Skibinski
(74) *Attorney, Agent, or Firm* — Posz Law Group, PLC

(57) ABSTRACT

A gate drive circuit includes one output element, a constant current drive circuit, and a constant voltage drive circuit. The output element outputs a gate drive signal to a gate of a gate driven switching element. The constant current drive circuit causes the output element to output the gate drive signal with a constant current. The constant voltage drive circuit causes the output element to output the gate drive signal with a constant voltage.

11 Claims, 11 Drawing Sheets

GATE DRIVE CIRCUIT

CROSS REFERENCE TO RELATED APPLICATIONS

The present application is a continuation application of International Patent Application No. PCT/JP2019/044705 filed on Nov. 14, 2019, which designated the U.S. and claims the benefit of priority from Japanese Patent Application No. 2018-230804 filed on Dec. 10, 2018. The entire disclosures of all of the above applications are incorporated herein by reference.

TECHNICAL FIELD

The present disclosure relates to a gate drive circuit.

BACKGROUND

In a gate driven switching element such as an Insulated Gate Bipolar Transistor (IGBT) and a power MOSFET, when overcurrent flows due to short circuit or the like and the overcurrent continues, rapid temperature rise occurs in the switch element and the switch element may fail.

SUMMARY

The present disclosure provides a gate drive circuit. The gate drive circuit includes one output element, a constant current drive circuit, and a constant voltage drive circuit. The output element outputs a gate drive signal to a gate of a gate driven switching element. The constant current drive circuit causes the output element to output the gate drive signal with a constant current. The constant voltage drive circuit causes the output element to output the gate drive signal with a constant voltage.

BRIEF DESCRIPTION OF DRAWINGS

The features and advantages of the present disclosure will become more apparent from the following detailed description made with reference to the accompanying drawings. In the drawings.

DETAILED DESCRIPTION

For example, short circuit energy, which is generated when overcurrent flows due to short circuit of a switch element, increases as a gate voltage generated between a gate and an emitter of IGBT increases. Thus, a gate drive circuit, which drives the switch element, is required to control the gate voltage to be constant during on-drive in order to reduce the short circuit energy and inhibit destruction.

The gate drive circuit for driving such a switch element includes a constant voltage control type and a constant current control type. The constant voltage control type can drive the switch element while controlling the gate voltage to be constant by a constant voltage control circuit. The constant voltage control type can have elements less than the constant current control type. Thus, the constant voltage control type can suppress cost, however there is a difficulty that switching loss is large.

On the other hand, the constant current control type has switching loss smaller than that of the constant voltage drive type. However, it is necessary to provide a power supply circuit upstream in the constant current control type. Thus, there is a difficulty that cost is high because, generally, multiple output power elements are to be connected in series.

The present disclosure provides a gate drive circuit that includes two functions of constant voltage control and constant current control, and has a low cost configuration without adding an output element of a drive unit.

An exemplary embodiment of the present disclosure provides a gate drive circuit. The gate drive circuit includes one output element, a constant current drive circuit, and a constant voltage drive circuit. The output element outputs a gate drive signal to a gate of a gate driven switching element. The constant current drive circuit causes the output element to output the gate drive signal with a constant current. The constant voltage drive circuit causes the output element to output the gate drive signal with a constant voltage.

In the exemplary embodiment of the present disclosure, the output element applies the gate drive signal to the gate driven switching element. The constant current drive circuit controls the gate drive signal at the constant current, and the constant voltage drive circuit controls the gate drive signal at the constant voltage. As a result, in the gate drive switch element, the gate voltage rises at a constant voltage rise rate due to the constant current. When a predetermined gate voltage is reached, the gate voltage is controlled to maintain the constant voltage. In this case, both constant current control and constant voltage control can be performed by one output element. Thus, the configuration can be achieved at low cost.

First Embodiment

A first embodiment of the present disclosure will be described with reference to FIGS. 1 to 3.

Figure 1:
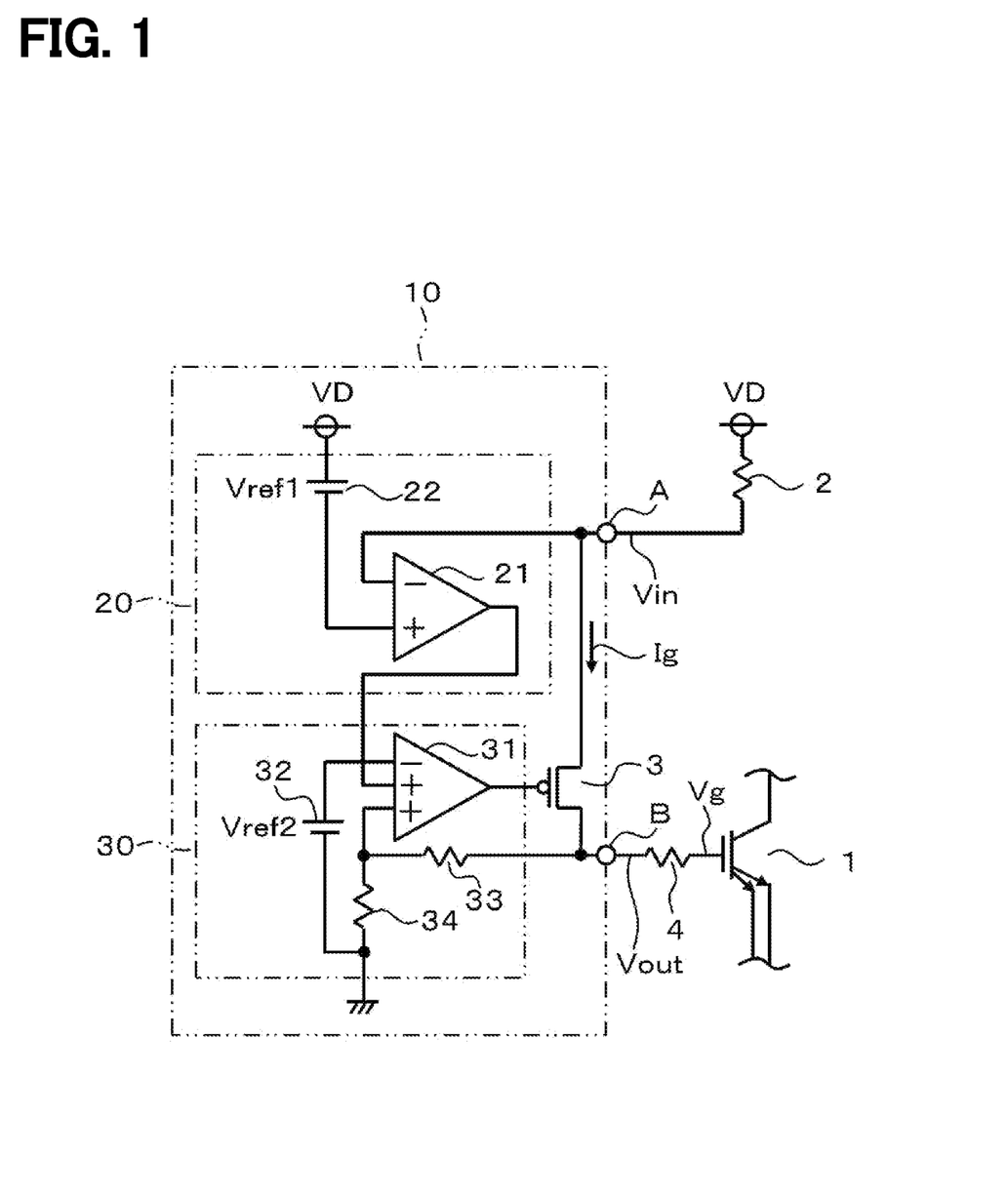
FIG. 1 is a diagram showing an electric configuration according to a first embodiment.
Figure 2:
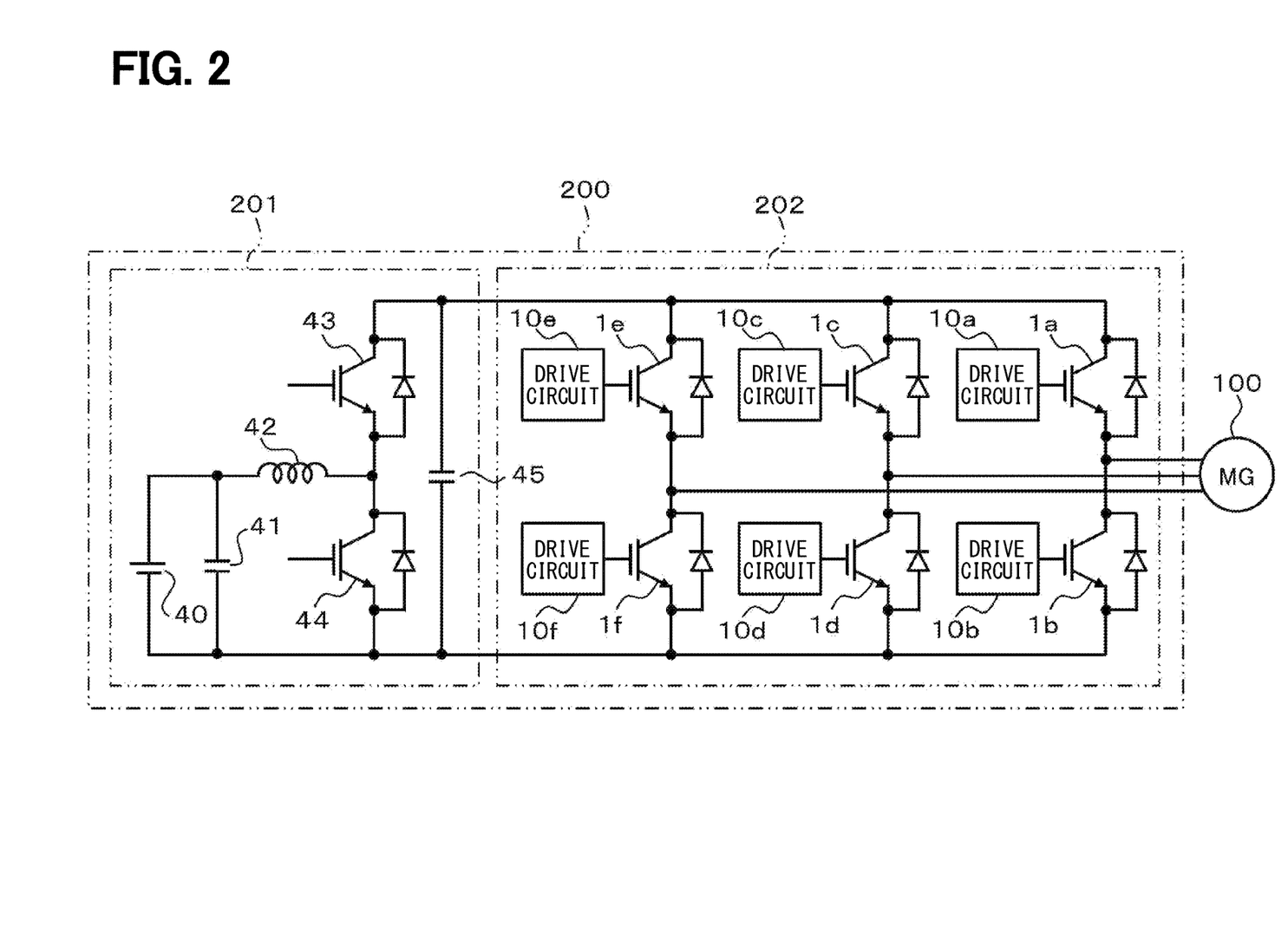
FIG. 2 is a diagram showing an overall electrical configuration of an application device according to the first embodiment.

In FIG. 1, which shows an electrical configuration, a gate drive circuit 10 drives an IGBT 1 as a gate driven switching element. The gate drive circuit 10 includes an input terminal A and an output terminal B. A direct current (DC) power supply VD supplies the power to the input terminal A via a shunt resistor 2 for current detection. The gate drive circuit 10 causes the output terminal B to output a gate drive signal via the source and drain of the P-channel type MOSFET 3 as an output element. The output terminal B is connected to the gate of the IGBT 1 via the gate resistor 4.

The gate drive circuit 10 includes a constant current drive circuit 20 and a constant voltage drive circuit 30. The constant current drive circuit 20 includes a first differential amplifier 21 and a first reference power supply 22. The input voltage Vin from the DC power supply VD is input to an inverting input terminal of the first differential amplifier 21 via the shunt resistor 2, and the first reference voltage Vref1 is input to a non-inverting input terminal of the first differential amplifier 21 from the DC power supply VD via the first reference power supply 22.

The constant voltage drive circuit 30 includes a 3-input type second differential amplifier 31, a second reference power supply 32, and voltage dividing resistors 33 and 34. The voltage dividing resistors 33 and 34 are connected in series to form a voltage dividing circuit, and are connected between the output terminal B and the ground. The common connection point P of the voltage dividing resistors 33 and 34 outputs a voltage obtained by dividing the output voltage Vout of the output terminal B. The second reference voltage Vref2 of the second reference power supply 32 is input to the inverting input terminal of the second differential amplifier 31, the output signal of the first differential amplifier 21 is input to the first non-inverting input terminal, and the divided voltage of the output voltage Vout is input to the second non-inverting input terminal via the voltage dividing resistor 33.

The second differential amplifier 31 calculates the difference between the second reference voltage Vref2 input to the inverting input terminal and the smaller value of the values of the first and second non-inverting input terminals, and outputs a signal corresponding to the calculated signal. That is, the second differential amplifier 31 outputs, to the gate of the MOSFET 3, the voltage corresponding to the difference between the second reference voltage Vref2 and the voltage value which is the smaller between the output voltage of the first differential amplifier 21 and the divided voltage of the output voltage Vout.

Although the above configuration is for driving the IGBT 1 on, the gate drive circuit 10 also includes a circuit configuration for driving the IGBT 1 off. For example, an N-channel MOSFET is connected between the gate of the IGBT 1 and the gate. In this case, when the MOSFET 3 is turned on after turning off, the MOSFET 3 perform the off operation by discharging the gate charge.

Further, the gate drive circuit 10 having the above configuration causes the IGBT 1 to be on by applying the gate voltage to the IGBT 1 when a gate drive signal Sg, which is a high-level and on signal, is given from the outside. Similarly, when a gate drive signal Sg, which is a low-level signal, of the off instruction is received, the gate drive circuit 10 stops applying the gate voltage to the IGBT 1 and discharges the gate charge to be in the off operation.

Next, an electrical configuration as an example for using the gate drive circuit 10 having the above configuration will be described with reference to FIG. 2. This configuration includes an electric generator 100 having the functions of a motor and a generator and a power converter 200. The motor generator 100 is used in an electric vehicle or the like. The power conversion device 200 rotates the motor generator 100 by generating three-phase current from the battery 40, and charges the battery 40 by converting the power generation output of the motor generator 100 into direct current.

The power conversion device 200 includes a DC power supply unit 201 and a three-phase inverter unit 202. In the DC power supply unit 201, a capacitor 41 is connected in parallel to the battery 40 which is a DC power supply. A high voltage DC current is generated by conducting electricity from the battery 40 to a boost coil 42 by controlling on and off of the switch elements 43 and 44 and charging the capacitor 45 connected to the output stage.

The three-phase inverter unit 202 includes six IGBTs 1a to 1f and forms a three-phase inverter circuit. The output of each of the three-phase arms is connected to corresponding one of the three terminals of the motor generator 100. The six IGBTs 1a to 1f are respectively driven and controlled by applying gate voltages to the drive circuits 10a to 10f having the same configuration. Each of the drive circuits 10a to 10f has the same configuration as the gate drive circuit 10 shown in FIG. 1.

Next, the operation of the power conversion device 200 having the above configuration will be briefly described, and then the operation of the gate drive circuit 10 will be described with reference to the time chart of FIG. 3.

In the power conversion device 200, when the motor generator 100 rotates, the DC power supply unit 201 charges the capacitor 45 by controlling the IGBTs 43 and 44 on and off to boost the terminal voltage of the battery 40 by the boost coil 42. In the three-phase inverter 202, the capacitors 45 are used as a DC power source, and the IGBTs 1a to 1f are respectively driven on and off by the drive circuits 10a to 10f to generate three-phase alternating current and supply the power to the motor generator 100.

When the motor generator 100 functions as a generator, the three-phase alternating current generated by the rotation is converted into the direct current via the three-phase inverter circuit 202 to charge the capacitor 45. The electric charge of the capacitor 45 charges the battery 40 with a DC voltage stepped down via the boost coil 42 by driving the IGBTs 43 and 44 on and off in the DC power supply unit 201.

As a result, the motor generator 100 rotates by supplying power to the battery 40 as a three-phase AC by the power conversion device 200. When the motor generator 100 regenerates the power as a generator, the power conversion device 200 converts the power to DC and lowers the voltage, and the power is returned to the battery 40.

Next, the operation of the gate drive circuit 10 will be described. As shown in FIG. 3, the gate drive circuit 10 starts operating at a time point t1 when a gate drive signal Sg of high level for instruction to be turned on is given from the outside at a time point t0. First, the input terminal A of the constant current drive circuit 20 receives the input voltage Vin via the shunt resistor 2. As a result, the inverting input terminal of the first differential amplifier 21 receives a voltage higher than the voltage set by the reference voltage Vref1. Thus, the MOSFET 3 is turned on. At this time, a voltage drop occurs due to the current Ig flowing from the DC power supply VD to the shunt resistor 2, and the input voltage Vin becomes lower than the terminal voltage of the DC power supply VD.

The input voltage Vin is a voltage that is lowered by the voltage obtained by the product of the current Ig flowing from the DC power supply VD to the shunt resistor 2. Therefore, assuming that the resistance value of the shunt resistor 2 is Rs, the input voltage Vin is a voltage that is lower than the voltage of the DC power supply VD by "Rs×Ig", which is the voltage drop in the shunt resistor 2.

The first differential amplifier 21 outputs a signal corresponding to the difference between the input voltage Vin and the voltage set by the first reference voltage Vref1. The output of the first differential amplifier 21 is controlled so that a predetermined gate current Ig set by the first reference voltage Vref1 flows through the shunt resistor 2. The output signal of the first differential amplifier 21 is input to the second differential amplifier 31 of the constant voltage drive circuit 30.

In the constant voltage drive circuit 30, the output voltage Vout of the output terminal B is controlled to be a predetermined gate voltage Vg set by the second reference voltage Vref2. In this case, when the output voltage Vout of the output terminal B does not reach the predetermined gate voltage Vg, the voltage applied to the second non-inverting input terminal is low, so the MOSFET 3 is fully turned on as shown in FIG. 3.

However, in the second differential amplifier 31, the value corresponding to the difference between the output signal from the first differential amplifier 21 and the second reference voltage Vref2 is smaller. Therefore, as shown in FIG. 3, the output signal from the first differential amplifier 21 becomes the dominant control element, and as a result, the gate signal for flowing the constant current is output to the gate of the MOSFET 3 in the control state.

Figure 3:
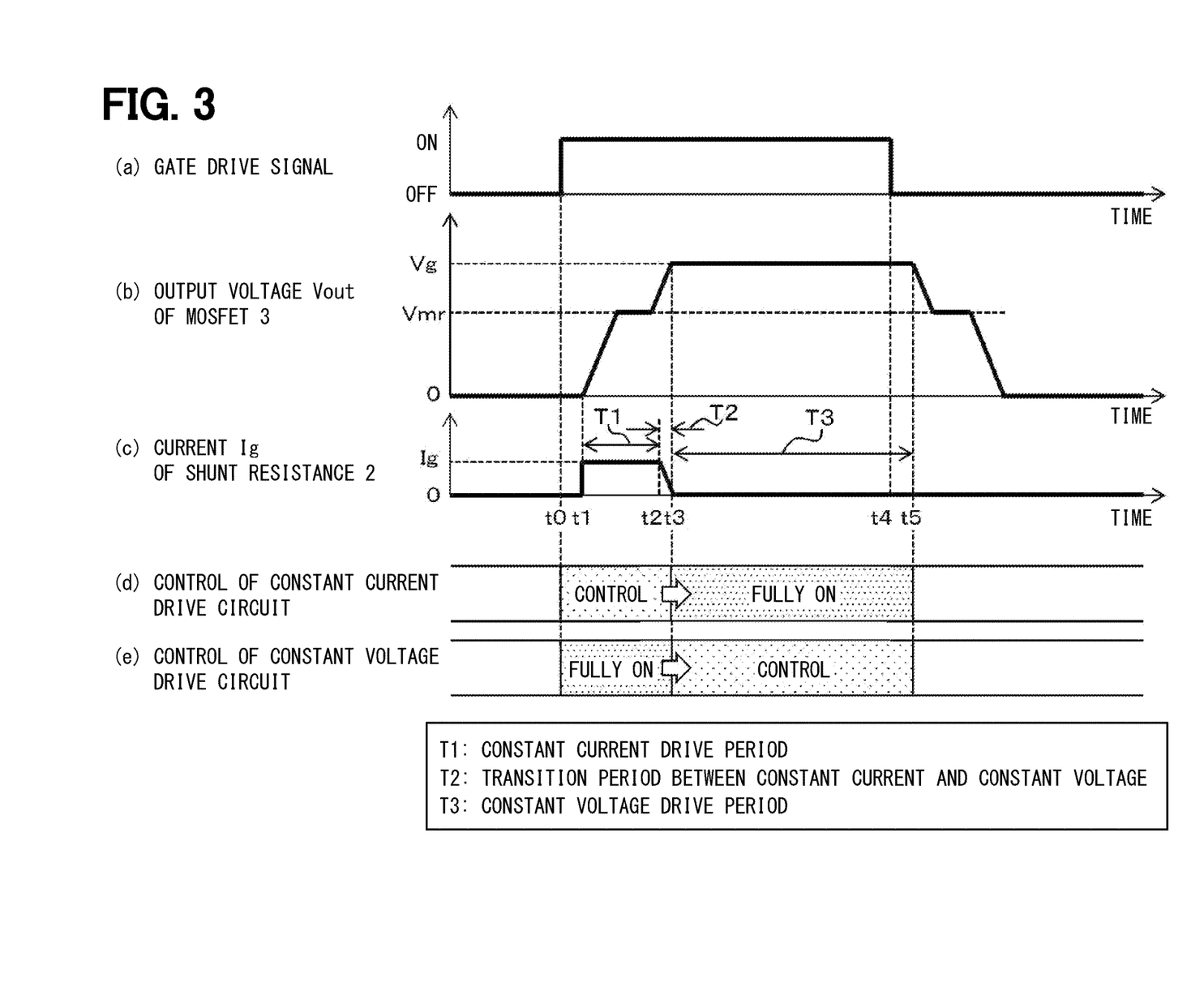
FIG. 3 is a time chart of the first embodiment.

As a result, as shown in FIG. 3, the MOSFET 3 is controlled so that the gate current Ig flows at a constant current, and the gate current Ig is output from the output terminal B to the gate of the IGBT 1. In the IGBT 1, the constant current Ig flows through the gate and the gate capacitance is charged with a constant current, so that the gate voltage Vg rises at a constant voltage change rate as shown in FIG. 3. When the mirror period in which the gate voltage of the IGBT 1 becomes constant is entered, the gate voltage Vg is fixed to the mirror voltage Vmr during the period until the time period t2 when the mirror period ends. As a result, the period T1 from the time point t0 to the time point t2 is the constant current drive period in which the control by the constant current drive circuit 20 is executed.

When the mirror period ends at the time point t2, the gate voltage Vg of the IGBT 1 rises again at a constant voltage change rate. After that, when the charging of the gate of the IGBT 1 progresses and the gate voltage Vg approaches a predetermined level, the gate current Ig of the MOSFET 3 decreases and the gate voltage Vg reaches a predetermined level at a time point t3. As a result, the period T2 from the time point t2 to the time point t3 is a constant current-constant voltage transition period in which the control state of the constant current drive is changed to the control state of the constant voltage drive. Further, during the periods T1 and T2, the constant current drive circuit 20 performs the constant current control, and the MOSFET 3 is controlled by the constant current output.

In the state after the time point t3, the current Ig becomes almost zero. Therefore, as shown in FIG. 3, the first differential amplifier 21 of the constant current drive circuit 20 fully turns on the MOSFET 3 to allow the current to flow. On the other hand, when the output voltage Vout of the constant voltage drive circuit 30 reaches a predetermined gate voltage Vg, the second differential amplifier 31 becomes substantially the same level as the second reference voltage Vref2. Therefore, the second differential amplifier 31 becomes an output that turns off the MOSFET 3.

That is, after the time point t3, the second differential amplifier 31 stops the current output to the gate of the MOSFET 3 when the output voltage Vout reaches a predetermined voltage regardless of the signal output from the first differential amplifier 21. As a result, as shown in FIG. 3, the second differential amplifier 31 keeps the gate voltage Vg by causing the gate current to flow by controlling the MOSFET 3 in response to the fluctuation of the gate voltage Vg of the IGBT 1.

As described above, the MOSFET 3 that applies the gate voltage of the IGBT 1 is driven with a constant current by control of the constant current drive circuit 20 immediately after being turned on by the gate drive circuit 10. After that, when the gate voltage Vg reaches a predetermined level, the constant voltage drive circuit 30 starts the constant voltage drive.

When the low level gate drive signal Sg is applied at the time point t4, the gate drive circuit 10 discharges the gate charge of the IGBT 1 by the off drive circuit at the time point t5. Then, as shown in FIG. 3, the gate voltage Vg is lowered to zero, and the IGBT 1 is turned off. As a result, the period T3 from the time point t3 to the time point t5 is the constant voltage drive period in which the control by the constant voltage drive circuit 30 is executed.

The configuration according to the first embodiment provides the MOSFET 3 as a common output element, and can drive the MOSFET 3 by automatically switching the control of the gate of the IGBT 1 by the constant current drive circuit 20 and the constant voltage drive circuit 30. Thus, the gate drive circuit 10 can be configured at low cost.

Second Embodiment

Figure 4:
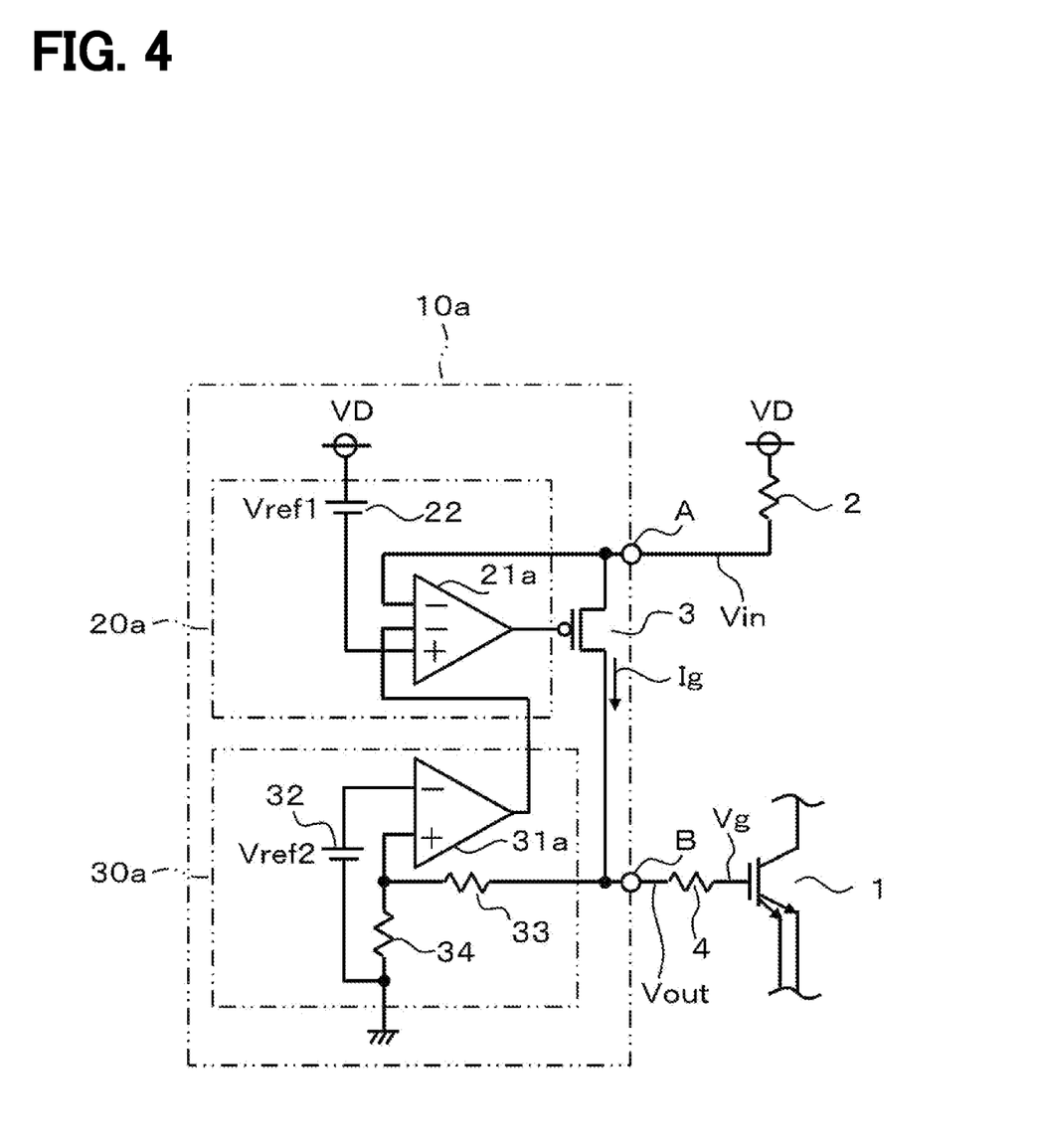
FIG. 4 is a diagram showing an electric configuration according to a second embodiment.

FIG. 4 shows a second embodiment, and portions different from the first embodiment will be described below. In this embodiment, the gate drive circuit 10a includes a constant current drive circuit 20a and a constant voltage drive circuit 30a, and outputs a gate signal to the gate of the MOSFET 3 by the constant current drive circuit 20a.

The constant current drive circuit 20a includes a first differential amplifier 21a instead of the first differential amplifier 21. The first differential amplifier 21a is a three-input type and has a function corresponding to the second differential amplifier 31 of the constant voltage drive circuit 30 in the first embodiment. On the other hand, the constant voltage drive circuit 30a includes a second differential amplifier 31a having two-input instead of the second differential amplifier 31. In this second embodiment, the configuration in which the first differential amplifier 21 and the second differential amplifier 31 in the first embodiment are functionally interchanged is adopted.

In the constant current drive circuit 20a, the first differential amplifier 21a inputs the input voltage Vin from the DC power supply VD to the first inverting input terminal via the shunt resistor 2 and the input terminal A. Further, the first differential amplifier 21a inputs the output signal of the second differential amplifier 31a to the second inverting input terminal, and the first reference voltage Vref1 from the DC power supply VD to the non-inverting input terminal via the first reference power supply 22. The output terminal of the first differential amplifier 21a is connected to the gate of the MOSFET 3 and applies the gate voltage.

Further, in the constant voltage drive circuit 30a, the inverting input terminal of the second differential amplifier 31a receives the second reference voltage Vref2 of the second reference power supply 32 and the non-inverting input terminal of the second differential amplifier 31a receives the voltage divider voltage of the output voltage Vout via the voltage dividing resistor 33.

The first differential amplifier 21a transmits, to the gate of the MOSFET 3, a voltage corresponding to a difference between the first reference voltage Vref1 input to the non-inverting input terminal and a voltage value which has a smaller difference between the value of the first inverting input terminal and the first reference voltage Vref1 or the value of the second inverting input terminal and the first reference voltage Vref1.

As a result, the first differential amplifier 21a generates a gate drive signal for the MOSFET 3 similarly to the second differential amplifier 31 of the first embodiment. Therefore, the gate drive circuit 10a performs constant current drive under the control of the constant current drive circuit 20a immediately after the IGBT 1 is turned on. After that, when the gate voltage Vg reaches a predetermined level, the constant voltage drive circuit 30a starts the constant voltage drive.

Therefore, the same operation and effects as those of the first embodiment can be obtained by the second embodiment.

Third Embodiment

Figure 5:
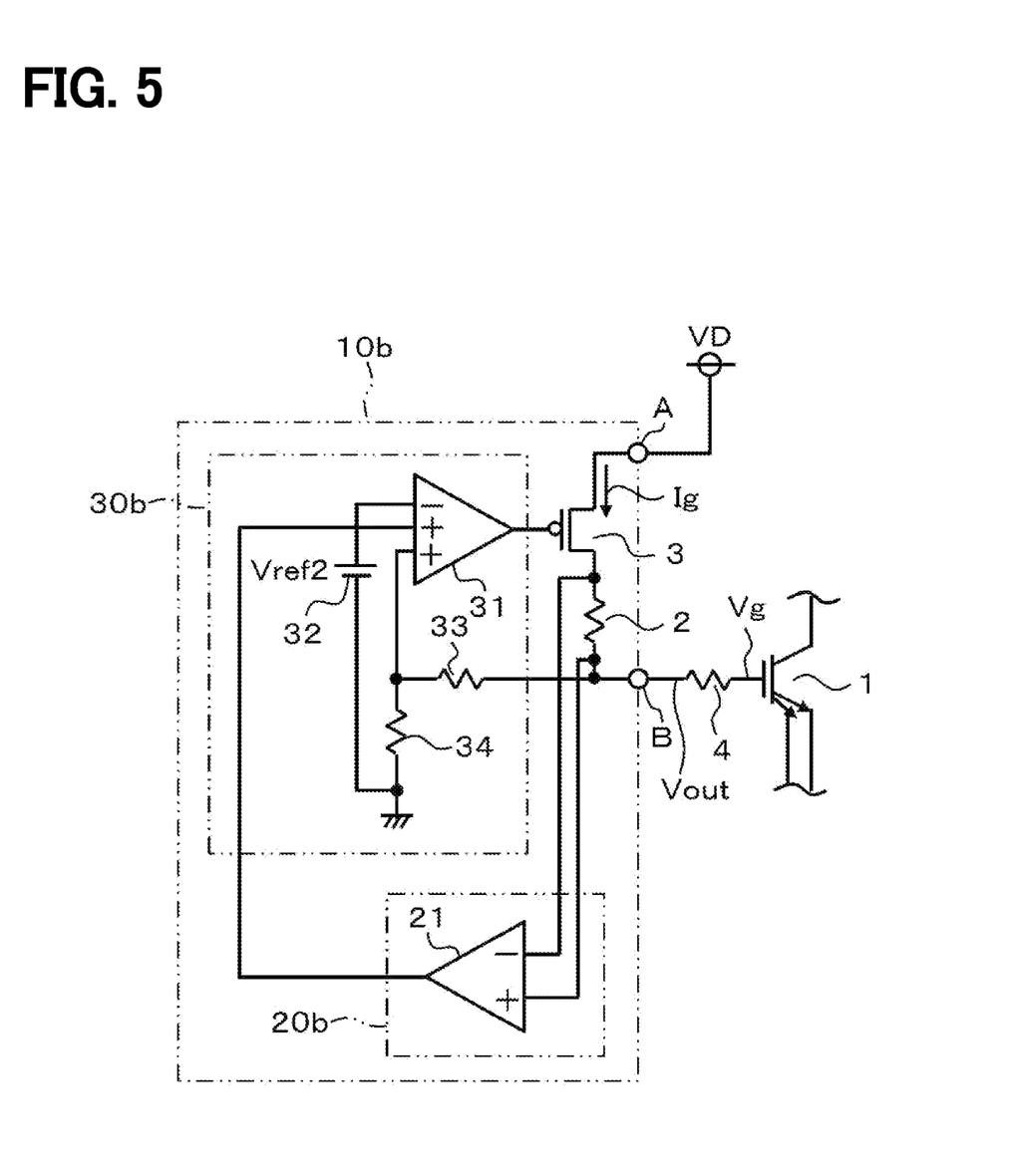
FIG. 5 is a diagram illustrating an electric configuration according to a third embodiment.

FIG. 5 shows a third embodiment, and the parts different from the first embodiment will be described below. In this embodiment, in the MOSFET 3, the source is directly connected to the DC power supply VD via the input terminal A, and the drain is connected to the output terminal B via the shunt resistor 2.

A gate drive circuit 10b is premised on the gate drive circuit 10 in the first embodiment, and a constant voltage drive circuit 30b has the similar configuration to the constant voltage drive circuit 30. In a constant current drive circuit 20b, both terminals of the shunt resistor 2 are connected between the terminals of the first differential amplifier 21. The constant current drive circuit 20b receives the voltage between the terminals of the shunt resistor 2.

According to the above configuration, a voltage proportional to the current Ig flowing through the shunt resistor 2 is generated similarly to the configuration of the first embodiment. The constant current drive circuit 20b transmits the gate drive signal such that the constant current Ig set by the second reference voltage Vref2 flows through the gate of the MOSFET 3 by the first differential amplifier 21.

At this time, in the constant voltage drive circuit 30b, the input signal to the second differential amplifier 31 becomes smaller because the output voltage Vout of the output terminal B does not reach a predetermined voltage, so that the difference from the second reference voltage Vref2 becomes large. On the other hand, the difference between the output signal from the first differential amplifier 21 of the constant current drive circuit 20b and the second reference voltage Vref2 becomes small. As a result, in this state, the constant current control state by the constant current drive circuit 20b is established.

When the gate voltage Vout of the MOSFET 3 reaches a predetermined gate voltage Vg after the mirror period, the signal from the output terminal B to the second differential amplifier 31 of the constant voltage drive circuit 30b becomes large, and difference between the second reference voltage Vref2 becomes small. On the other hand, since the gate current Ig becomes almost zero in this configuration, the output signal from the first differential amplifier 21 becomes large. As a result, in this state, the constant voltage control state by the constant voltage drive circuit 30b is established.

Therefore, the same operation and effects as those of the first embodiment can be obtained by the third embodiment.

Fourth Embodiment

Figure 6:
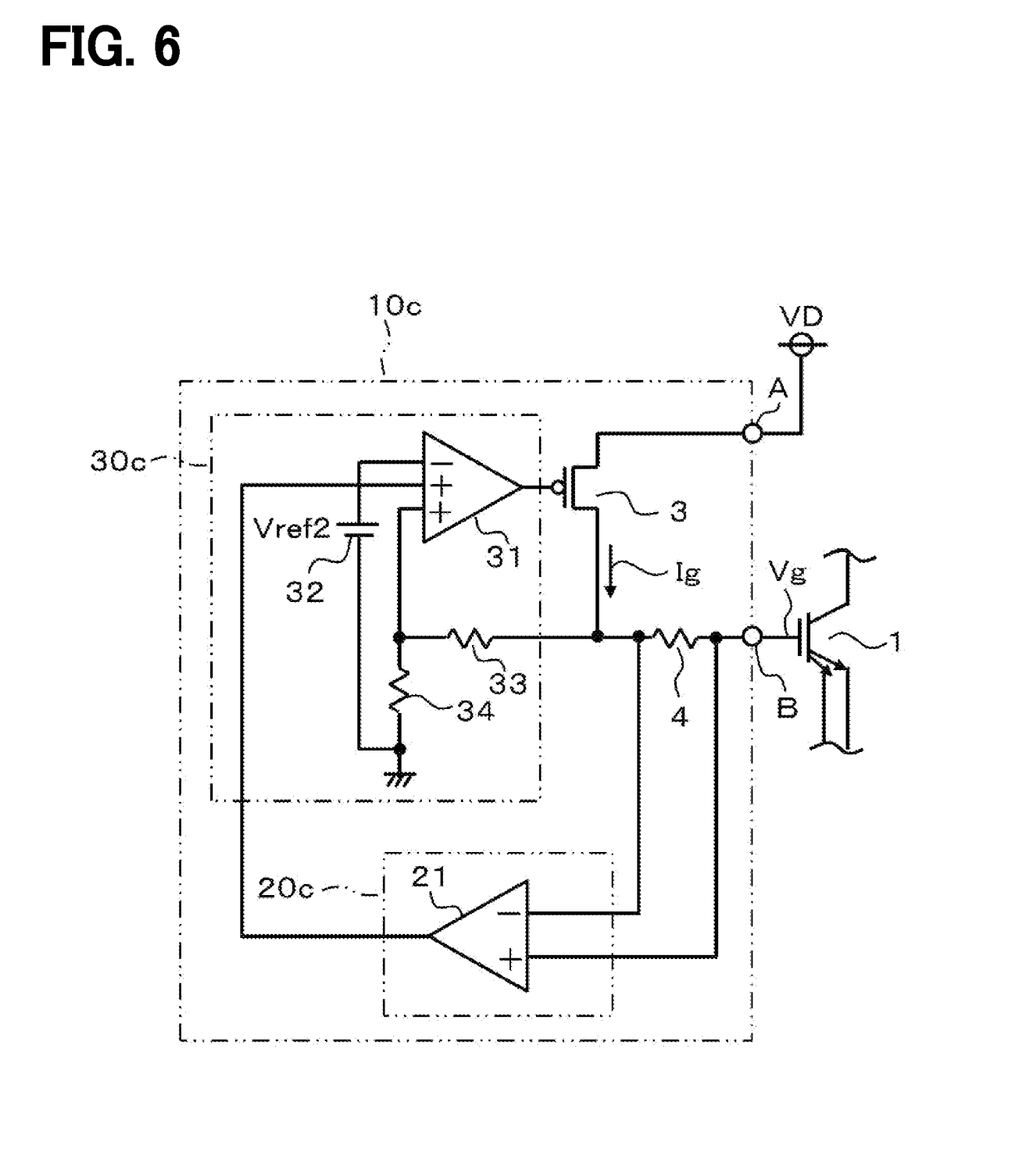
FIG. 6 is a diagram showing an electric configuration according to a fourth embodiment.

FIG. 6 shows a fourth embodiment, and the parts different from the third embodiment will be described below. In this embodiment, the shunt resistor 2 of the third embodiment is omitted, and the gate current Ig is detected by the gate resistor 4.

The configuration can transmit the gate drive signal to the MOSFET 3 and perform the drive control of the IGBT 1 similarly to the third embodiment. Therefore, the same effects as those of the third embodiment can be obtained by the fourth embodiment.

Further, in this configuration, since the gate resistor 4 is used for current detection, the number of resistance elements can be reduced when the functions of the gate current detection operation and the gate input resistance can be combined.

Fifth Embodiment

Figure 7:
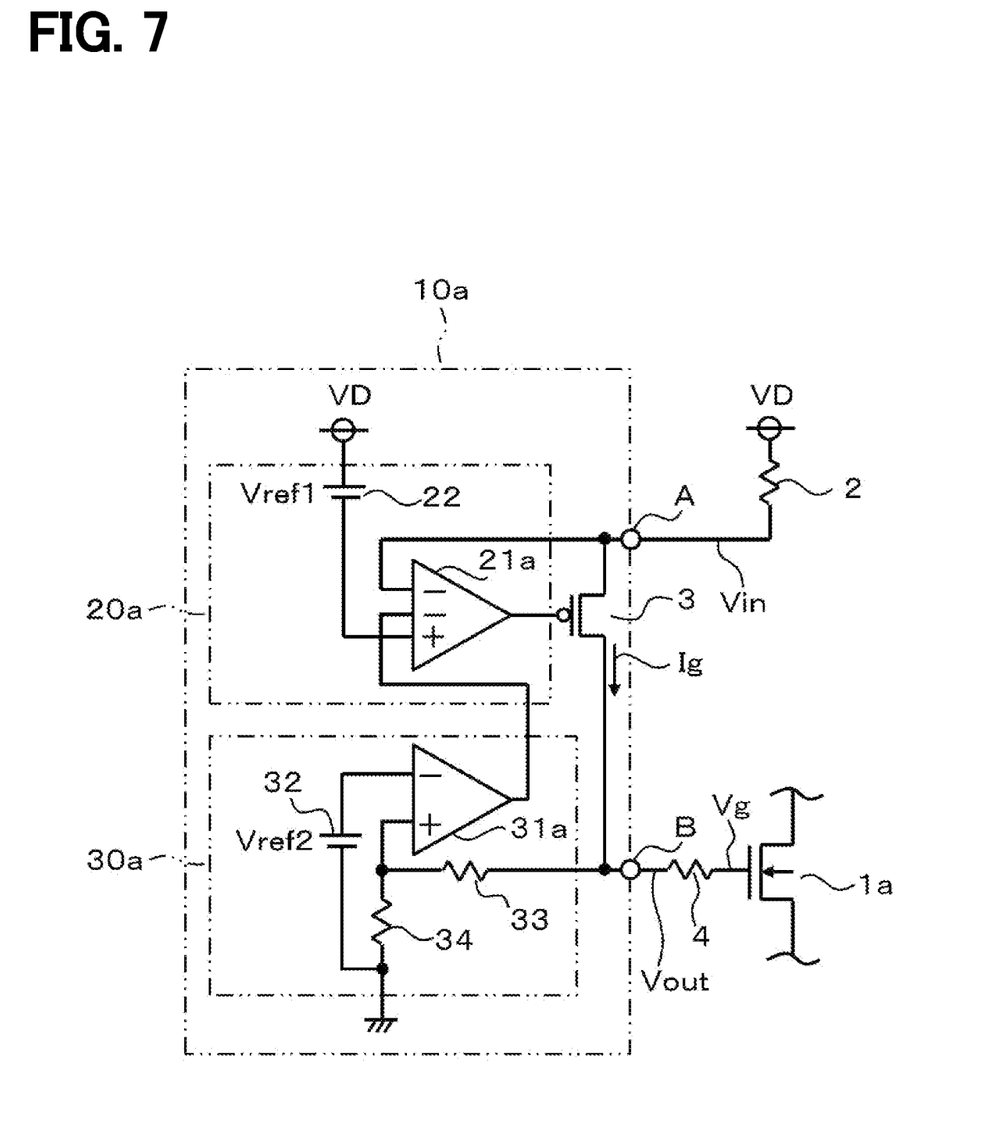
FIG. 7 is a diagram showing an electric configuration according to a fifth embodiment.

FIG. 7 shows a fifth embodiment, and the parts different from the second embodiment will be described below. In this embodiment, the gate drive circuit 10a has the similar configuration to that of the second embodiment. Further, the configuration drives, as the gate driven switching element, an n-channel type MOSFET 1a instead of the IGBT 1.

According to the above configuration, similarly to the second embodiment, the constant voltage drive circuit 20a performs the constant current drive control of the MOSFET 1a at the time of on drive, and the constant voltage drive circuit 30a performs the constant voltage drive control when the gate voltage reaches a predetermined level.

Therefore, the same operation and effects as those of the second embodiment can be obtained by the fifth embodiment.

Sixth Embodiment

Figure 8:
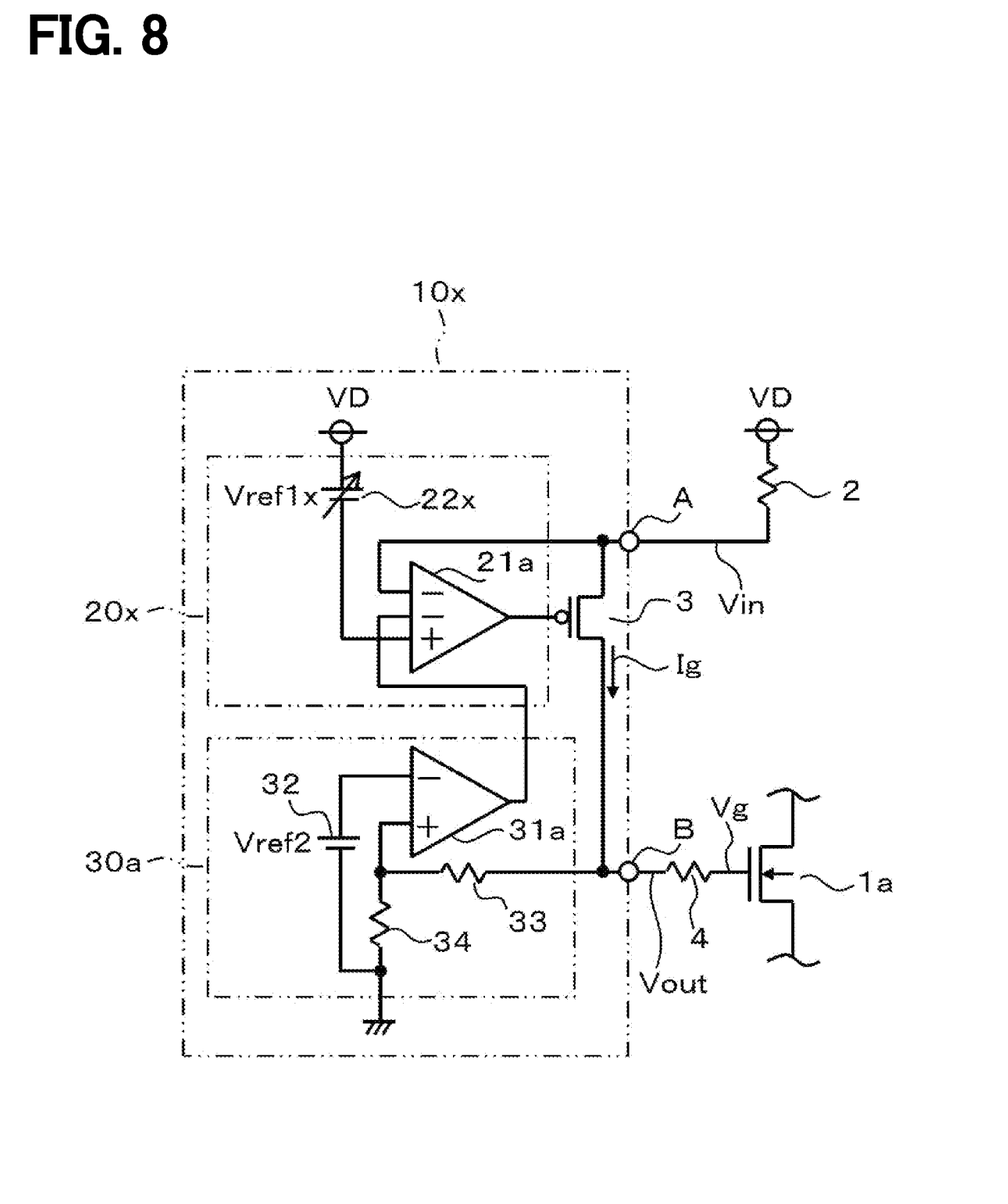
FIG. 8 is a diagram showing a first electric configuration according to a sixth embodiment.
Figure 9:
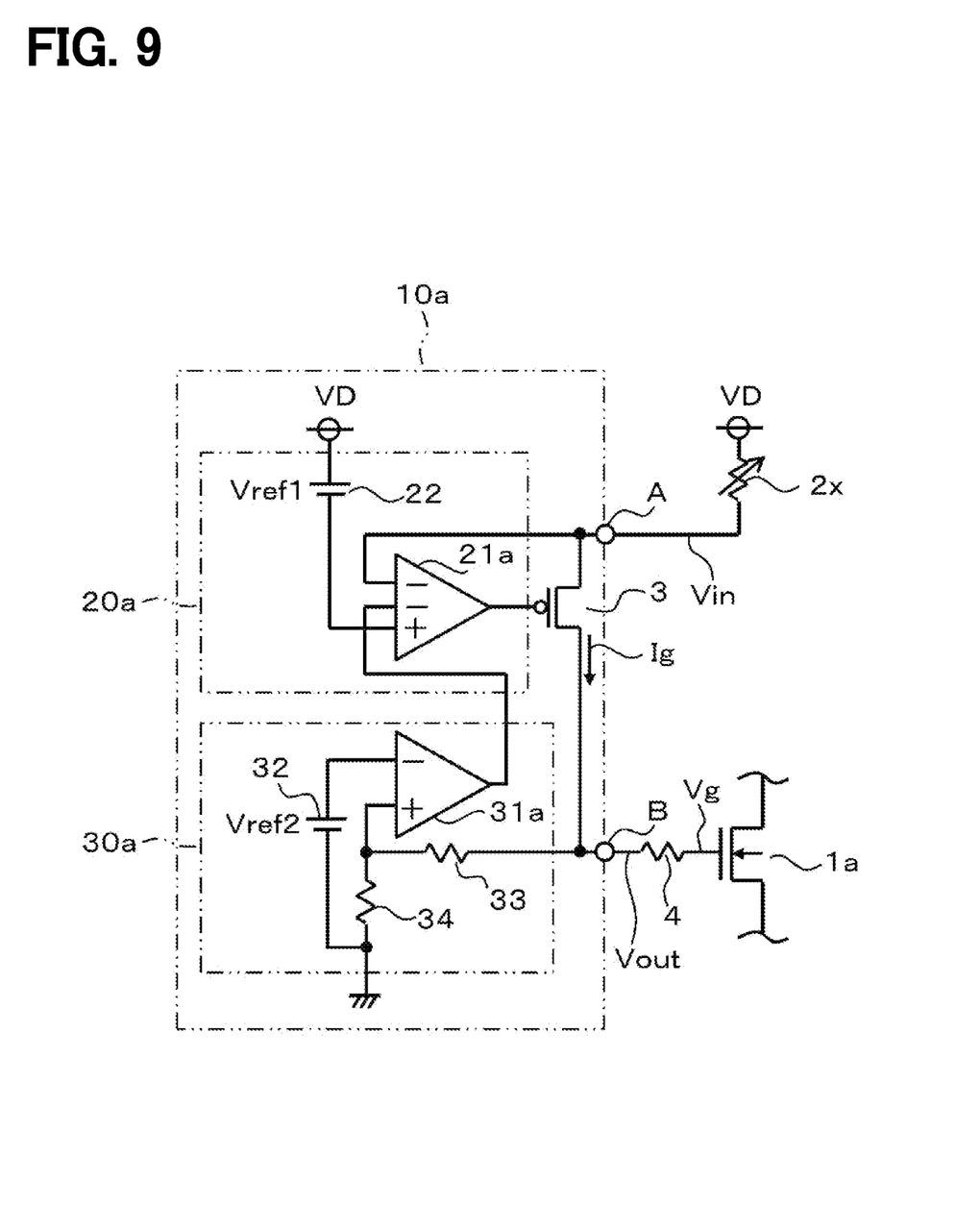
FIG. 9 is a diagram showing a second electric configuration according to the sixth embodiment.

FIGS. 8 and 9 show a sixth embodiment, and the parts different from the fifth embodiment will be described below. In the sixth embodiment, in each of the constant current drive controls of FIGS. 8 and 9, the constant current Ig value can be changed.

As shown in FIG. 8, instead of the gate drive circuit 10a of the fifth embodiment, a gate drive circuit 10x is provided having a constant current drive circuit 20x instead of the constant current drive circuit 20a. The constant current drive circuit 20x includes a variable first reference power supply 22x that gives a variable first reference voltage Vref1x instead of the first reference power supply 22 that gives the first reference voltage Vref1.

With this configuration, the constant current drive circuit 20x can set the level at the time when the constant current Ig flows through the gate of the MOSFET 3 can be set to a different level by adjusting the variable first reference voltage Vref1x. Thus, the voltage change rate when the gate voltage Vg of the MOSFET 1a is increased can be adjusted.

Further, as shown in FIG. 9, the gate drive circuit 10a is left as it is in the fifth embodiment, and a variable shunt resistor 2x capable of setting a variable shunt resistor Rx is provided instead of the shunt resistor 2 having a predetermined shunt resistor R. As a result, even when the current Ig is the same, the input voltage Vin of the input terminal A changes by changing the value of the variable shunt resistor Rx of the variable shunt resistor 2x. Therefore, the level of the constant current set by the first reference voltage Vref1 is set to a substantially different level. Thus, the voltage change rate when the gate voltage Vg of the MOSFET 1a is increased can be adjusted.

According to the sixth embodiment, the configuration can set the level of the current Ig to the different level by adjusting the variable first reference power supply 22x by the variable first reference voltage Vref1x or the variable shunt resistance value Rx is adjusted by the variable shunt resistor 2x. As a result, it is possible to deal with variations in the characteristics of the MOSFET 3 and the characteristics of the MOSFET 1a as a control target, and to easily perform the drive control under different conditions.

Seventh Embodiment

Figure 10:
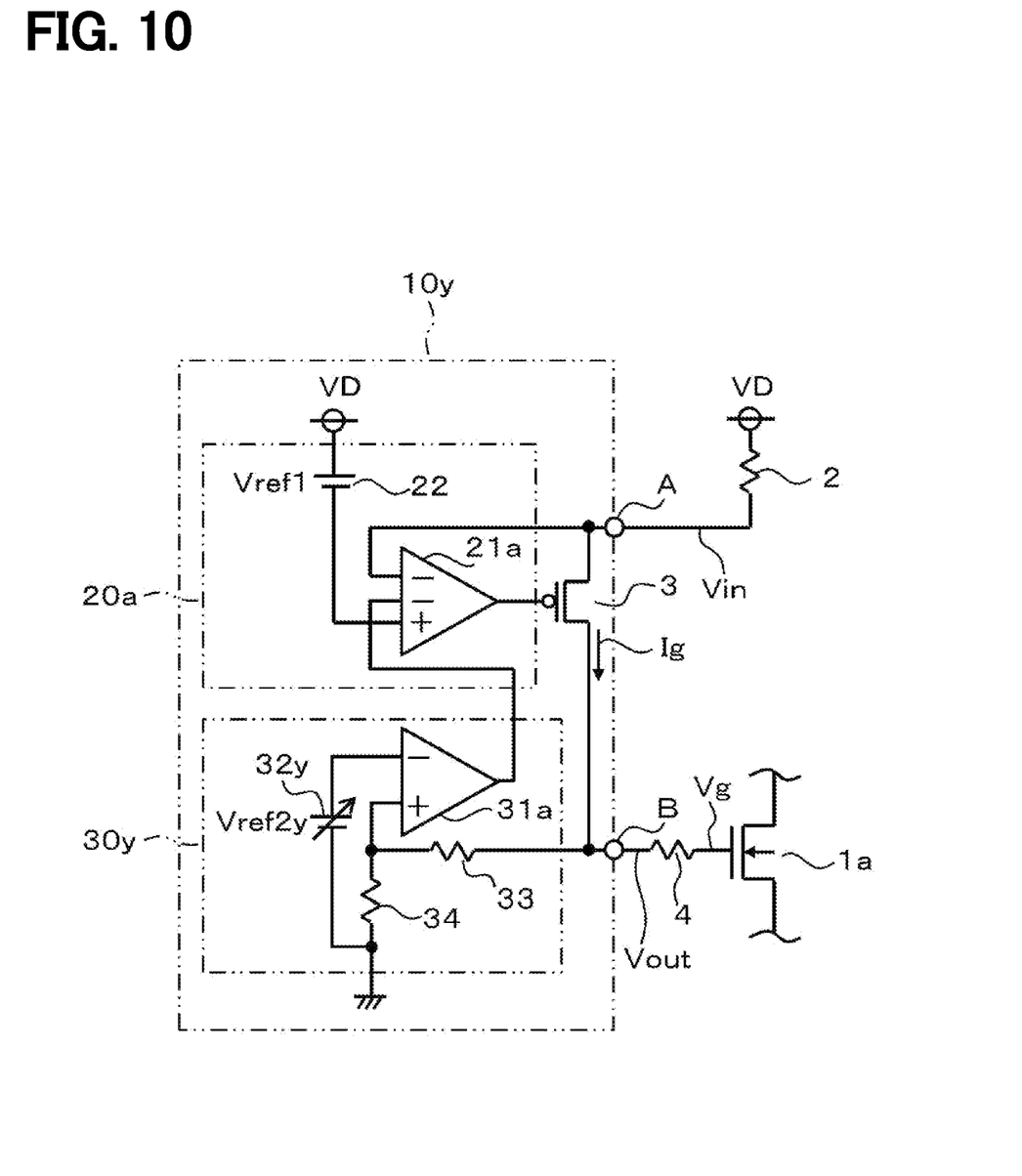
FIG. 10 is a diagram showing a first electric configuration according to a seventh embodiment.
Figure 11:
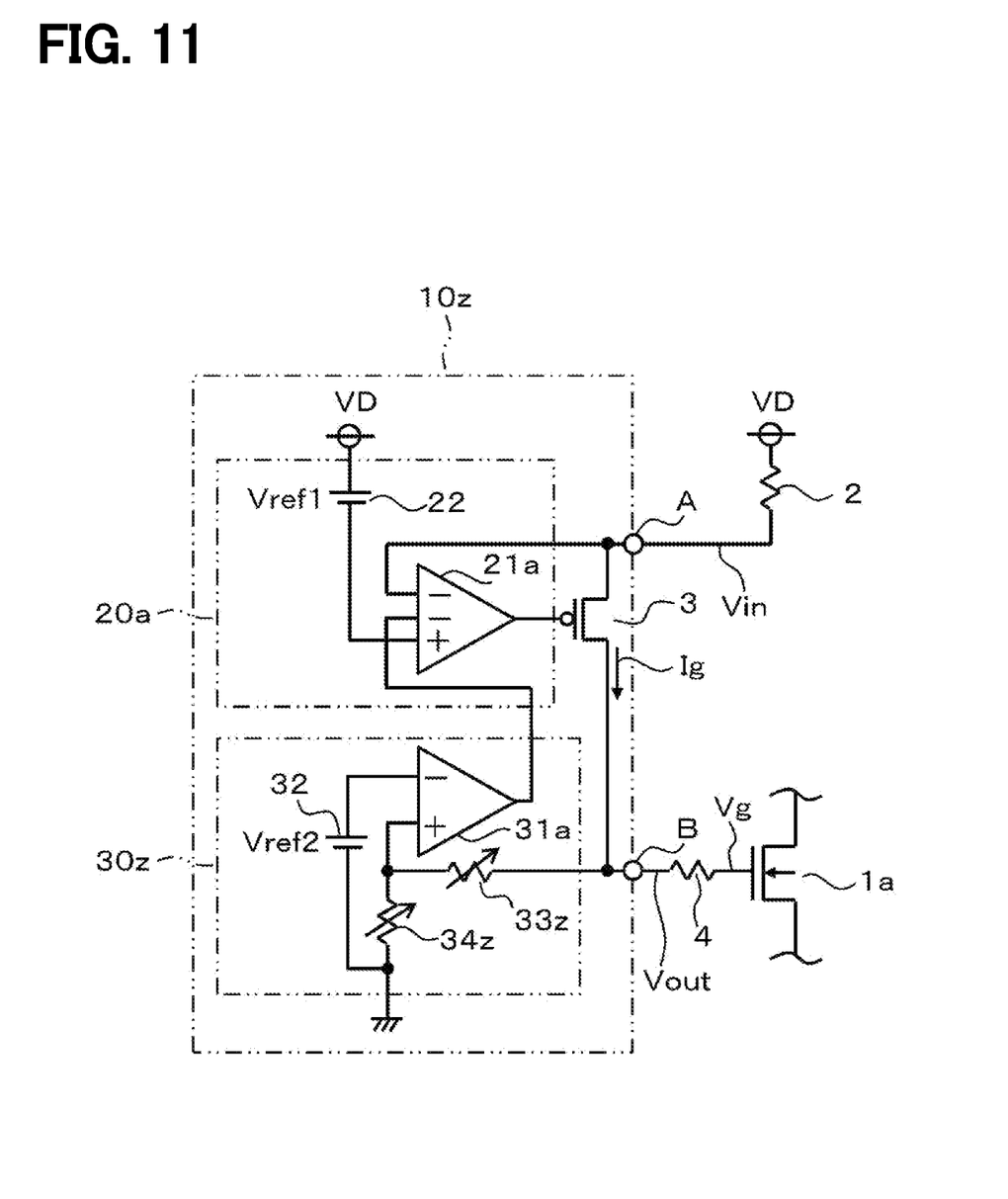
FIG. 11 is a diagram showing a second electric configuration according to the seventh embodiment.

FIGS. 10 and 11 show a seventh embodiment, and the parts different from the fifth embodiment will be described below. In the seventh embodiment, in each of the constant voltage drive controls of FIGS. 10 and 11, the constant voltage Vg value can be changed.

As shown in FIG. 10, instead of the gate drive circuit 10a of the fifth embodiment, a gate drive circuit 10y is provided having a constant voltage drive circuit 30y instead of the constant voltage drive circuit 30a. The constant voltage drive circuit 30y includes a variable second reference power supply 32y that gives a variable second reference voltage Vref2x instead of the second reference power supply 32 that gives the second reference voltage Vref2.

With this configuration, the constant voltage drive circuit 30y can set the level at the time when the constant voltage Vg is given to the gate of the MOSFET 3 to a different level by adjusting the variable second reference voltage Vref2y. Thus, the configuration can adjust the level of the gate voltage Vg of the MOSFET 1a.

As shown in FIG. 11, instead of the gate drive circuit 10a of the fifth embodiment, a gate drive circuit 10z is provided having a constant voltage drive circuit 30z instead of the constant voltage drive circuit 30a. The constant voltage drive circuit 30z includes variable voltage dividing resistors 33z and 34z instead of the voltage dividing resistors 33 and 34 that detect the output voltage Vout.

With this configuration, the constant voltage drive circuit 30z can adjust the level for giving the constant voltage Vg to the gate of the MOSFET 3. Thus, the configuration can adjust the level of the gate voltage Vg of the MOSFET 1a.

According to the seventh embodiment, the configuration can adjust the variable second reference voltage Vref2y by the variable second reference power supply 32y and set the detection level of the output voltage to a different level by adjusting the resistance values of the variable voltage dividing resistors 33z and 34z. As a result, it is possible to deal with variations in the characteristics of the MOSFET 3 and the characteristics of the MOSFET 1a as a control target, and to easily perform the drive control under different conditions.

Other Embodiments

The present disclosure should not be limited to the embodiments described above. Various embodiments may further be implemented without departing from the scope of the present disclosure, and may be modified or expanded as described below.

In the first, third, and fourth embodiments, the control target can be the MOSFET 1a instead of the IGBT 1. In the fifth to seventh embodiments, the control target can be the IGBT 1 instead of the MOSFET 1a.

In the sixth embodiment and the seventh embodiment, the change of the level setting of the variable first reference voltage Vref1x or the variable second reference voltage Vref2y and the change of the setting of the resistance values of the variable shunt resistor 2x or the variable voltage dividing resistors 33z and 34z can be set manually or electrically. Further, in the configuration of electrically setting, a circuit for automatically adjusting to achieve a predetermined control level can be separately provided.

In the first to seventh embodiments, a composite gate drive circuit that is appropriately combined with each other can be configured.

The gate drive circuits 10, 10a, 10b, 10c, 10x, 10y, and 10z of the present disclosure can be also applied to a gate driven switching elements in a circuit configuration other than the IGBTs 1a to 1f of the three-phase inverter 202 that drives the motor generator 100.

Although the present disclosure has been described in accordance with the examples, it is understood that the present disclosure is not limited to such examples or structures. The present disclosure covers various modification examples and equivalent arrangements. In addition, various combinations and configurations, as well as other combinations and configurations that include only one element, more, or less, are within the scope and spirit of the present disclosure.

What is claimed is:

1. A gate drive circuit comprising:
   only one output element configured to output a gate drive signal to a gate of a gate driven switching element;
   a constant current drive circuit configured to cause the output element to output the gate drive signal with a constant current; and
   a constant voltage drive circuit configured to cause the output element to output the gate drive signal with a constant voltage,
   wherein the constant current drive circuit and the constant voltage drive circuit are configured to control the one output element.

2. The gate drive circuit according to claim 1, wherein
   an output of one of the constant current drive circuit and the constant voltage drive circuit is connected to the output element, and
   an output of another one of the constant current drive circuit and the constant voltage drive circuit is connected to an input of the one of the constant current drive circuit and the constant voltage drive circuit.

3. The gate drive circuit according to claim 2, wherein
   the constant current drive circuit causes a gate voltage of the gate driven switching element to rise at a constant voltage change rate by the constant current until the gate voltage reaches the constant voltage, and
   the constant voltage drive circuit causes the gate voltage to keep the constant voltage after the gate voltage reaches the constant voltage.

4. The gate drive circuit according to claim 1, wherein
   the constant current drive circuit includes:
   a first reference power supply configured to generate a first reference voltage,
   a shunt resistor provided in a path between a power supply and the output element, and
   a first differential amplifier configured to (i) control the output element such that a voltage between the shunt resistor and the output element approaches the first reference voltage, and (ii) cause the output element to flow a shunt current determined by a resistance value of the shunt resistor and the first reference voltage.

5. The gate drive circuit according to claim 1, wherein
   the constant voltage drive circuit includes:
   a second reference power supply configured to generate a second reference voltage, and
   a second differential amplifier configured to control the output element such that a gate voltage of the gate driven switching element approaches the second reference voltage.

6. The gate drive circuit according to claim 1, wherein
the constant current drive circuit is configured to adjust a value of a shunt current flowing the output element.

7. The gate drive circuit according to claim 1, wherein
the constant voltage drive circuit is configured to adjust a gate voltage applied to the gate driven switching element.

8. The gate drive circuit according to claim 1, wherein
the constant current drive circuit applies the constant current until a gate voltage of the gate driven switching element reaches a predetermined level, and
the constant voltage drive circuit applies the constant voltage after the gate voltage reaches the predetermined level.

9. The gate drive circuit according to claim 1, wherein
the one output element includes a gate.

10. The gate drive circuit according to claim 1, wherein
the one output element includes a transistor.

11. The gate drive circuit according to claim 1, wherein
the one output element is configured to be controlled by one of the gate drive signal with a constant current and the gate drive signal with a constant voltage.

* * * * *